(12) United States Patent
Chien et al.

(10) Patent No.: US 6,461,959 B1
(45) Date of Patent: Oct. 8, 2002

(54) METHOD OF FABRICATION OF A CONTACT PLUG IN AN EMBEDDED MEMORY

(75) Inventors: Sun-Chieh Chien; Chien-Li Kuo, both of Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/885,049

(22) Filed: Jun. 21, 2001

(51) Int. Cl.⁷ .............................................. H01L 21/44
(52) U.S. Cl. ..................... 438/672; 438/241; 438/396
(58) Field of Search .................... 438/210, 241, 438/253, 256, 396, 633, 666, 672; 257/306, 296

(56) References Cited

U.S. PATENT DOCUMENTS 6,168,985 B1 * 1/2001 Asano ..................... 438/241

* cited by examiner

Primary Examiner—David Nelms
Assistant Examiner—Dung A Le
(74) Attorney, Agent, or Firm—Winston Hsu

(57) ABSTRACT

A semiconductor wafer is provided having both a memory array region and a periphery circuit region. A plurality of gate and LDD are formed in the memory array region. Next, a silicon nitride layer and a second dielectric layer are formed on the surface of the semiconductor wafer, and each contact plug is also formed in the second dielectric layer of the memory array region. The second dielectric layer and the silicon nitride layer in the periphery circuit region are then removed, followed by forming each gate, LDD and spacer in the periphery circuit region by way of a photo-etching-process(PEP), ion implantation, and a deposition process. Finally, a source and drain are formed adjacent to each gate in the periphery circuit region. A self-aligned silicide (salicide) process is performed to form a silicide layer on the surface of each contact plug in the memory array region and on the surface of each gate, source and drain in the periphery circuit region.

16 Claims, 10 Drawing Sheets

METHOD OF FABRICATION OF A CONTACT PLUG IN AN EMBEDDED MEMORY

FIELD OF THE INVENTION

The present invention provides a method for fabrication of a contact plug in an embedded memory, and, more specifically, to a contact plug with reduced resistance.

DESCRIPTION OF THE PRIOR ART

In order to avoid short-circuiting of devices in an embedded memory, an insulation layer is positioned between each device and the circuit as a whole. A photo-etching process (PEP) is then used to form a plurality of contact holes in the insulation layer. A conductive layer fills each contact hole to electrically connect each metal-oxide-semiconductor (MOS) transistor with the circuit.

Please refer to FIG. 1 to FIG. 8. FIG. 1 to FIG. 8 are schematic diagrams of a method of fabricating a landing via and a strip contact in an embedded memory according to the prior art. As shown in FIG. 1, defined on the surface of a silicon substrate 16 of a semiconductor wafer 10 is a memory array region 12 and a periphery circuit region 14. The memory array region 12 comprises at least a cell-well 18, and the periphery circuit region 14 comprises at least an N-well 20 and a P-well 22. In the prior art, a plurality of gates 24, 26, 28 are first formed, separately, in the memory array region 12 and in the periphery circuit region 14. A spacer 30 and a lightly doped drain (LDD) 32 are formed adjacent to each gate 24, 26, 28. As well, a source 34 and a drain 36 are also formed adjacent the gates 26, 28, which are isolated from each other by the shallow trench isolation (STI) structure 15.

As shown in FIG. 2, a dielectric layer 38, such as a silicon oxide layer, is then formed on the surface of the semiconductor wafer 10. A photo lithographic process is used to define a pattern of several shallow metal connection regions 40 on the surface of the dielectric layer 38, as shown in FIG. 3. Next, another photolithographic process is performed to define a first contact window 44, a second contact window 42, and a third contact window 46 in the dielectric layer 38, as shown in FIG. 4. The first contact window 44 is used to connect to a capacitor, the second contact window 42 subsequently forms a landing via and connects to a bit line, and the third contact window 46 subsequently forms a strip contact and connects to a source or drain in the periphery circuit region 14. The depths of the first contact window 44, the second contact window 42 and the third contact window 46 are all equal, and thus the three contact windows are horizontally aligned.

As shown in FIG. 5, a photolithographic process is then used to form a fourth contact window 48 in the dielectric layer 38. The fourth contact window 48 is used to connect to a gate in the strip contact of the periphery circuit region 14. Since the depth of the fourth contact window 48 is shallower than that of the other contact windows, its horizontal alignment differs to that of the first contact window 44, the second contact window 42 and the third contact window 46. The third contact window 46 and the fourth contact window 48 are separately connected to the gate and source or drain of transistors, and therefore the two contact windows are located on different vertical planes. As shown in FIG. 6, a barrier layer 50 of titanium nitride and a dielectric layer 52 of tantalum oxide are formed, respectively, on the substrate 16.

As shown in FIG. 7, a photoresist layer (not shown) is used as a mask to etch the dielectric layer 52 so that the dielectric layer 52 remains only in the second contact window 42 and its associated metal connection region 40. As shown in FIG. 8, a metal layer 54 is deposited on the surface of substrate 16 that fills each contact window 42, 44, 46, 48, and each metal connection region 40. Finally, the dielectric layer 38 is used as an etching stop layer for chemical mechanical polishing (CMP) of the metal layer 54.

However, in the disclosure of the prior art method for fabricating an embedded memory, the landing via and local interconnect are separately formed after fabricating each gate in memory array region and the periphery circuit region. The process according to prior art is thus more complicated and costly. Moreover, only a conductive layer fills each landing via and local interconnect to serve as a conducting material, leading to higher contact resistance and poor electrical conductance.

SUMMARY OF THE INVENTION

It is therefore a primary objective of the present invention to provide a fabrication method of a contact plug in an embedded memory, integrating the fabrication process of each gate and contact plug, and to reduce the resistance of each contact plug.

The present method involves first forming a first dielectric layer and an undoped polysilicon layer on the surface of a semiconductor wafer that has both a memory array region and a periphery circuit region. The undoped polysilicon layer in the memory array region is then transformed to a doped polysilicon layer, followed by forming a passivation layer and a first photoresist layer on the surface of the semiconductor wafer to form a plurality of gates and LDDs in the memory array region. Next, a silicon nitride layer, a second dielectric layer, and a second photoresist layer are formed on the surface of the semiconductor wafer. A plurality of contact plug holes are then formed in the second dielectric layer and filled by a polysilicon layer to form each contact plug in the memory array region. The second dielectric layer, the silicon nitride layer and the passivation layer in the periphery circuit region are removed to form each gate in the periphery circuit region. Thereafter, LDDs and spacers are formed for each gate in the periphery circuit region, followed by forming a source and drain adjacent to each gate in the periphery circuit region. Finally, a self-aligned silicide (salicide) process is performed to form a silicide layer on the top surface of each contact plug in the memory array region, on the top surface of each gate and the surface of each source and drain in the periphery circuit region. The silicide layer formed on the surface of each contact plug is used to reduce the contact resistance of each contact plug.

The present method of fabricating contact plugs in an embedded memory integrates the fabrication process of each gate and contact plug in the memory array region and periphery circuit region of the embedded memory. Also, the present invention simultaneously forms a silicide layer on the top surface of each contact plug in the memory array region, on the top surface of each gate and the surface of each source and drain in the periphery circuit region. As a result, electrical resistance is decreased and electrical performance is increased.

These and other objectives of the present invention will no doubt become obvious to those of ordinary skill in the art after reading the following detailed description of the preferred embodiment, which is illustrated in the various figures and drawings.

DESCRIPTION OF THE PREFERRED EMBODIMENT

Figure 1:
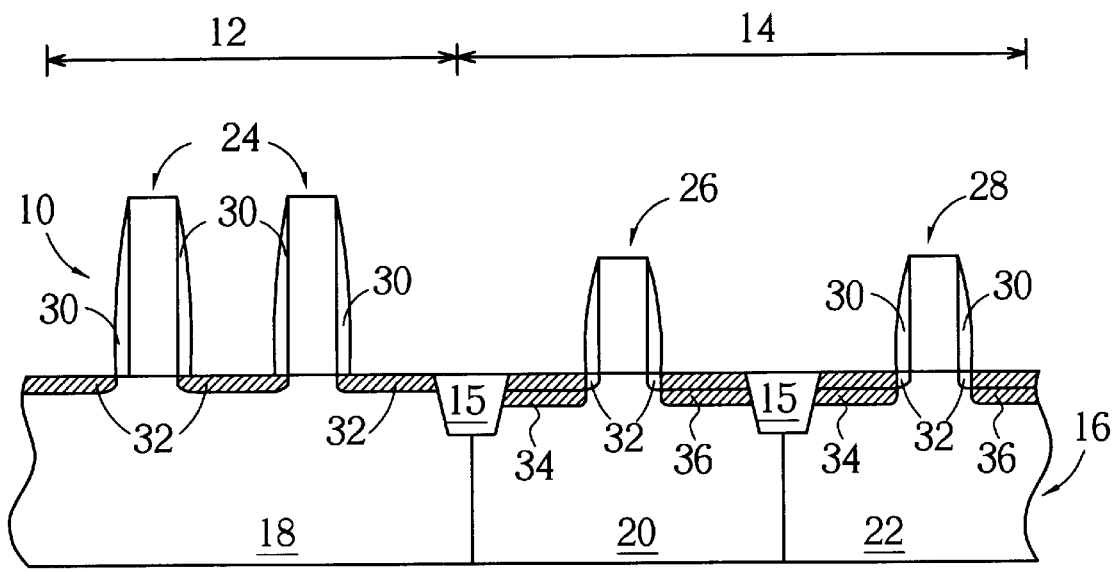
FIG. 1 to FIG. 8 are schematic diagrams of the fabrication of contact plugs in an embedded memory according to the prior art.
Figure 2:
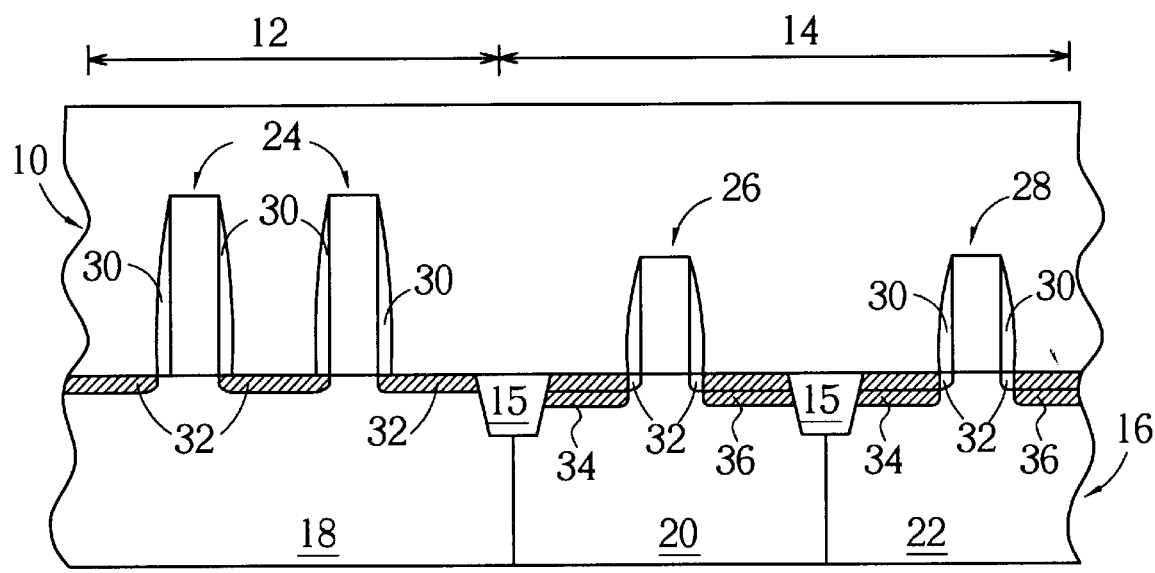
Figure 3:
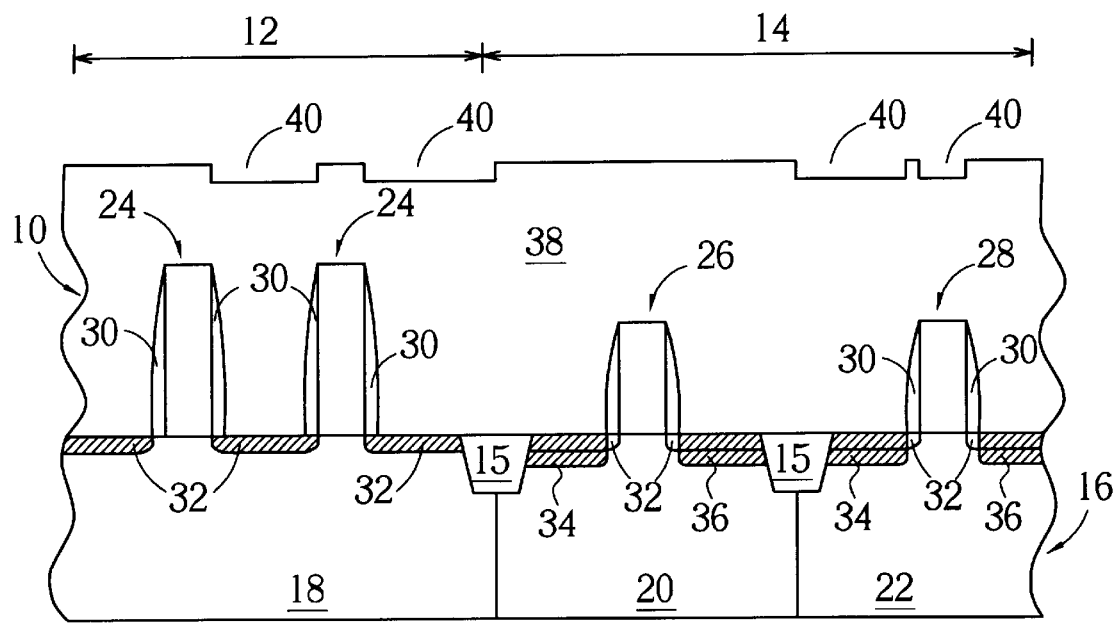
Figure 4:
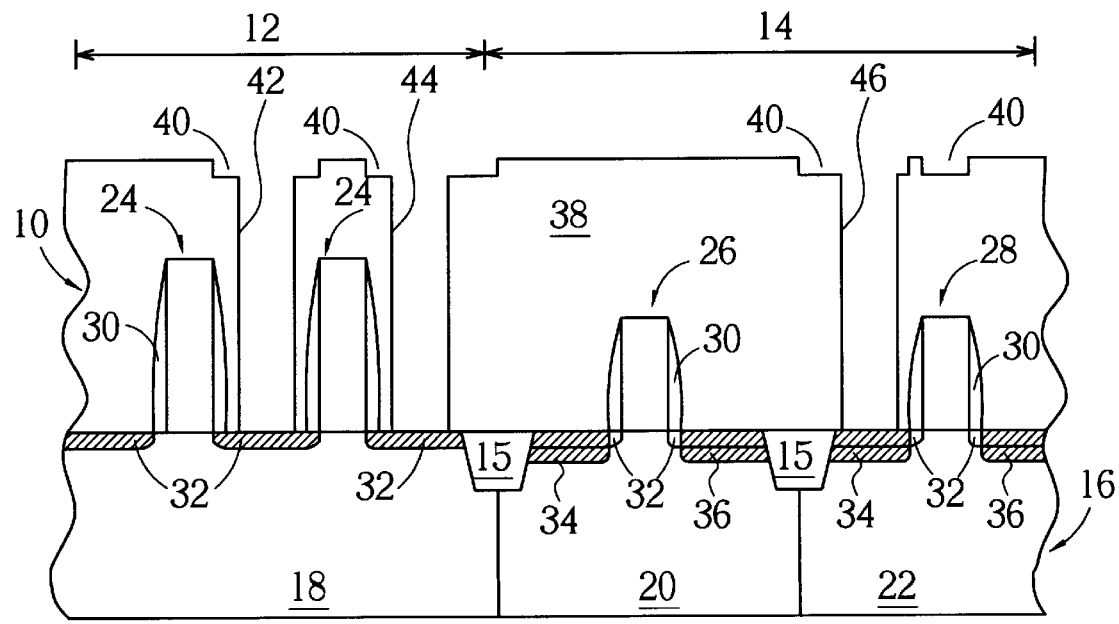
Figure 5:
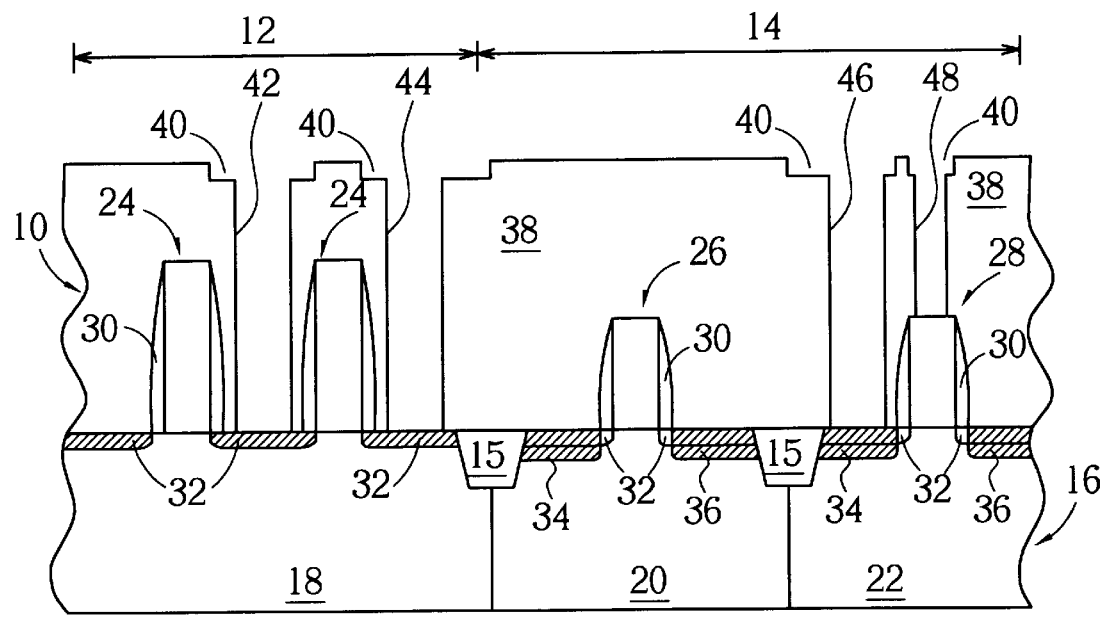
Figure 6:
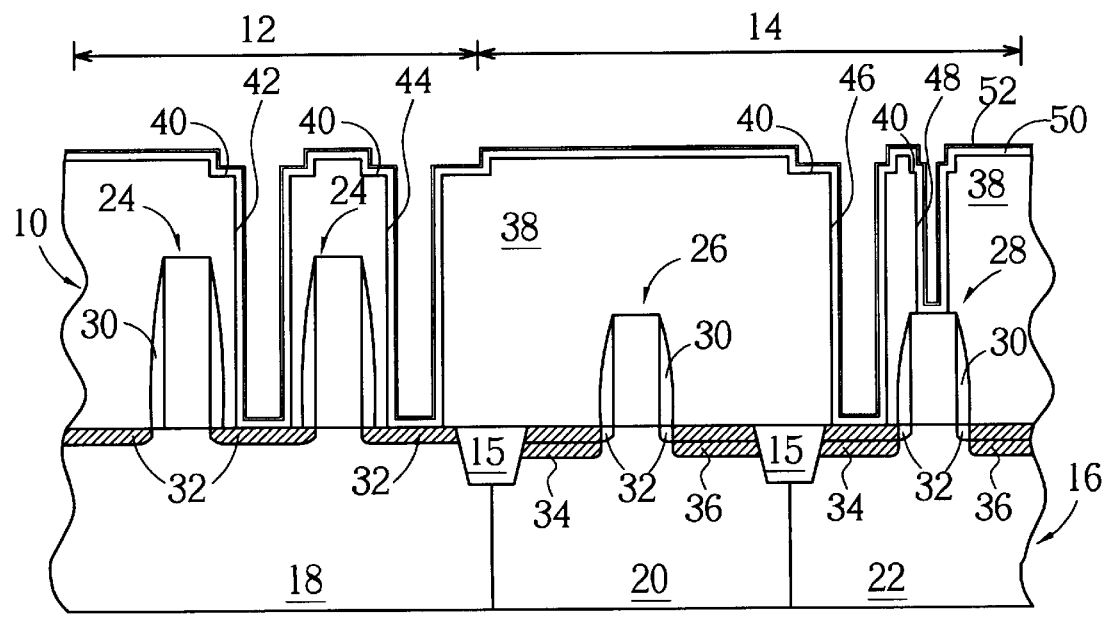
Figure 7:
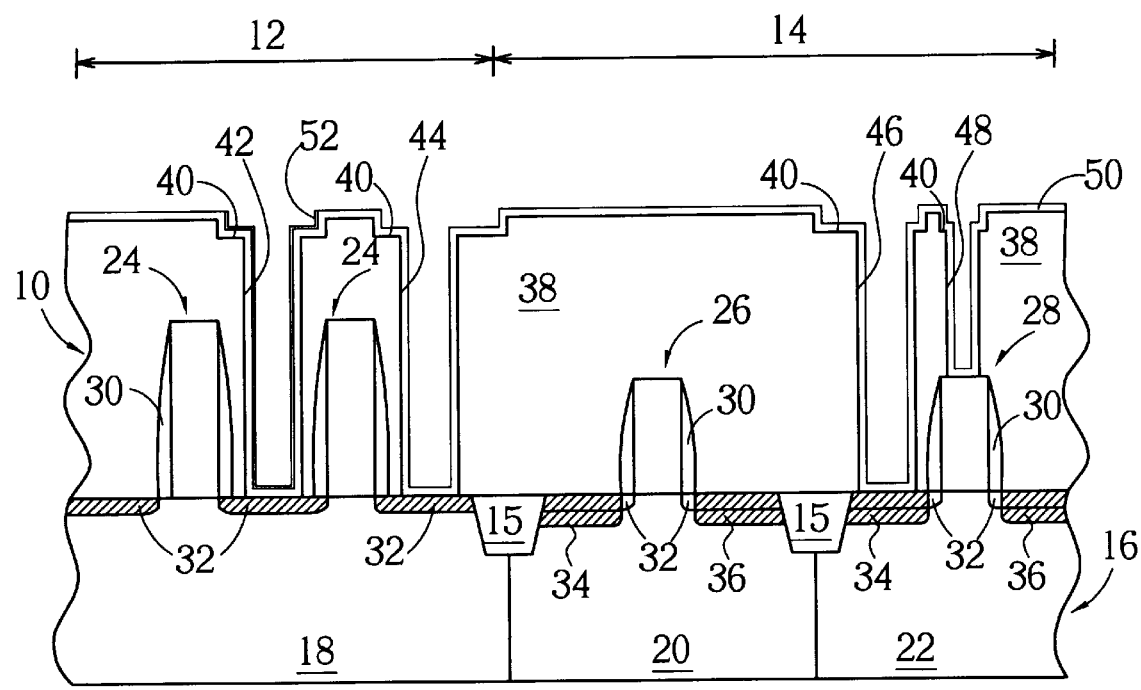
Figure 8:
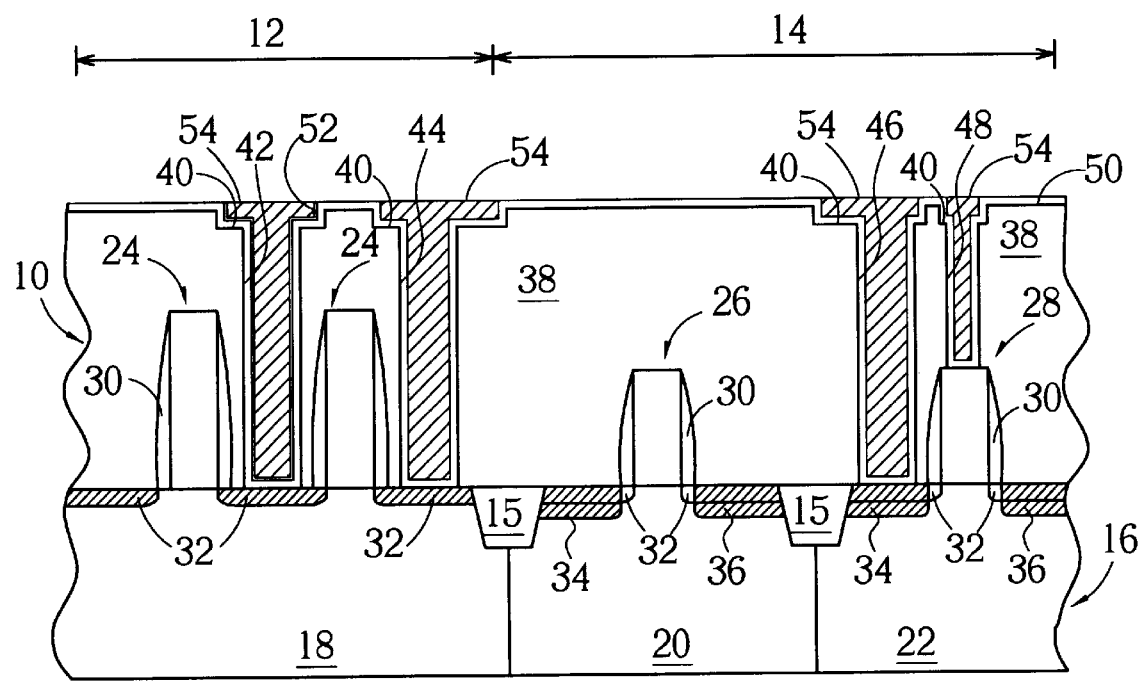
Figure 9:
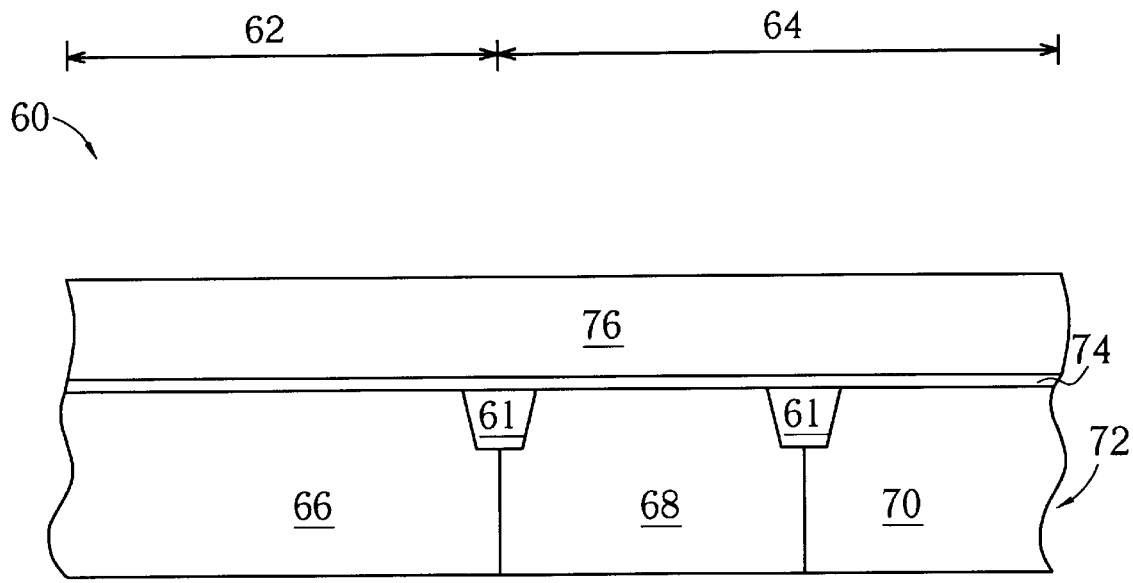
FIG. 9 to FIG. 19 are schematic diagrams of the fabrication of contact plugs in an embedded memory according to the present invention.

Please refer to FIG. 9 to FIG. 19. FIG. 9 to FIG. 19 are schematic diagrams of fabricating contact plugs of an embedded memory on a semiconductor wafer 60 according to the present invention. As shown in FIG. 9, the semiconductor wafer 60 has both a memory array region 62 and a periphery circuit region 64 defined on the surface of a silicon substrate 72. The memory array region 62 comprises at least a cell-well 66, and the periphery circuit region 64 comprises at least an N-well 68 and at least a P-well 70. Several shallow trench isolation (STI) structures 61 are formed to separate each region.

Figure 10:
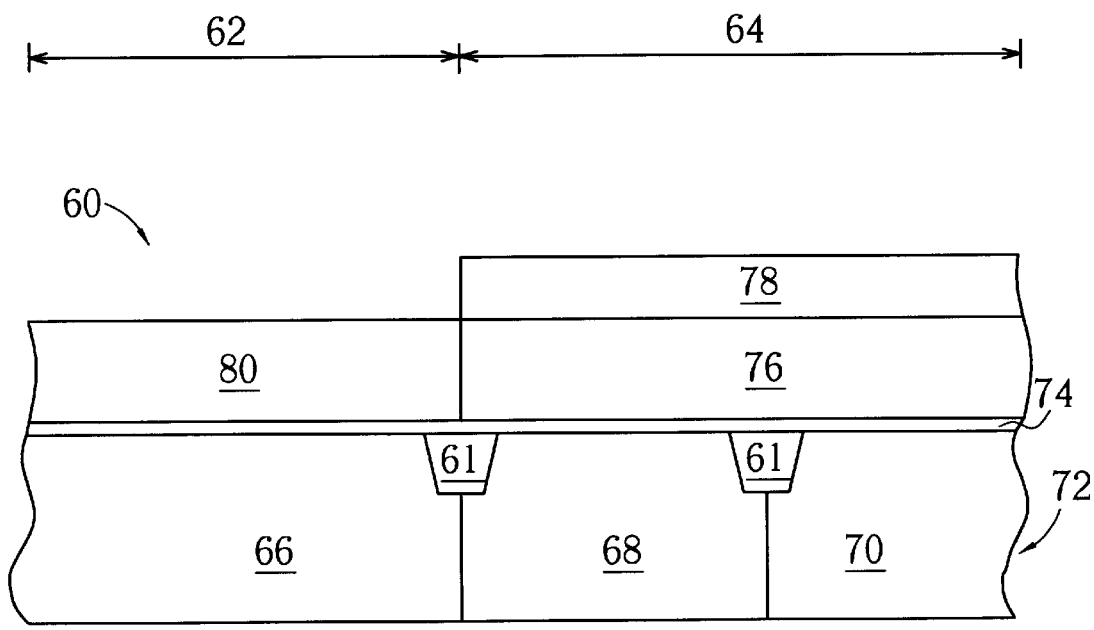

The present invention involves first forming a dielectric layer 74 and an undoped polysilicon layer 76, in sequence, on the surface of the semiconductor wafer 60. The dielectric layer 74 is composed of silicon dioxide and functions as a gate oxide for each gate. Then, as shown in FIG. 10, a mask layer 78 is formed in the periphery circuit region 64. An ion implantation process is performed on the undoped polysilicon layer 76 in the memory array region 62, the undoped polysilicon layer 76 thus subsequently becoming a doped polysilicon layer 80.

Figure 11:
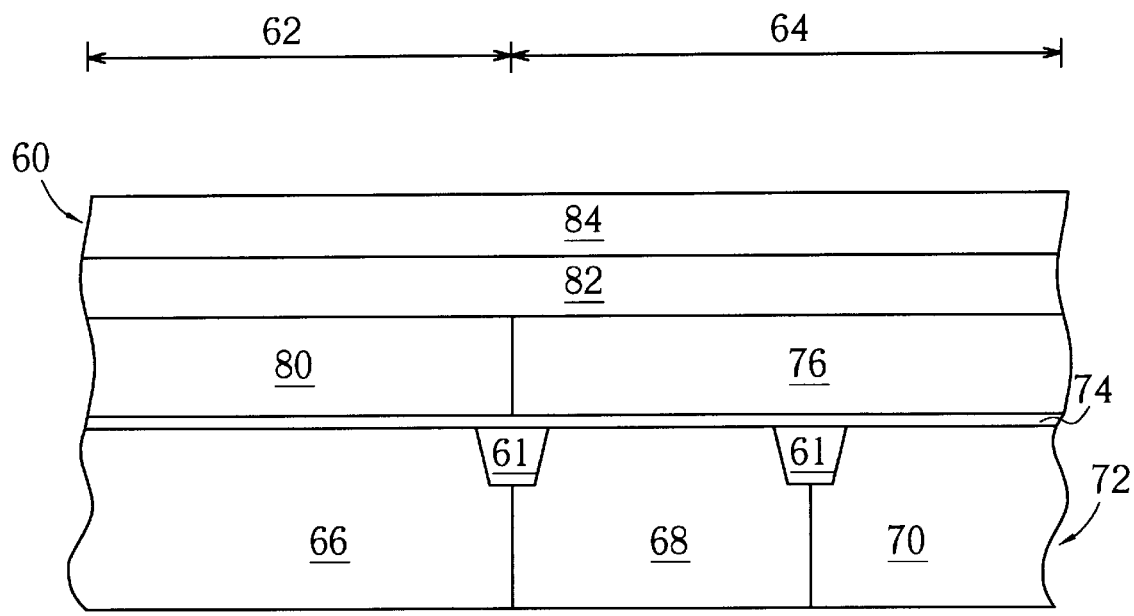
Figure 12:
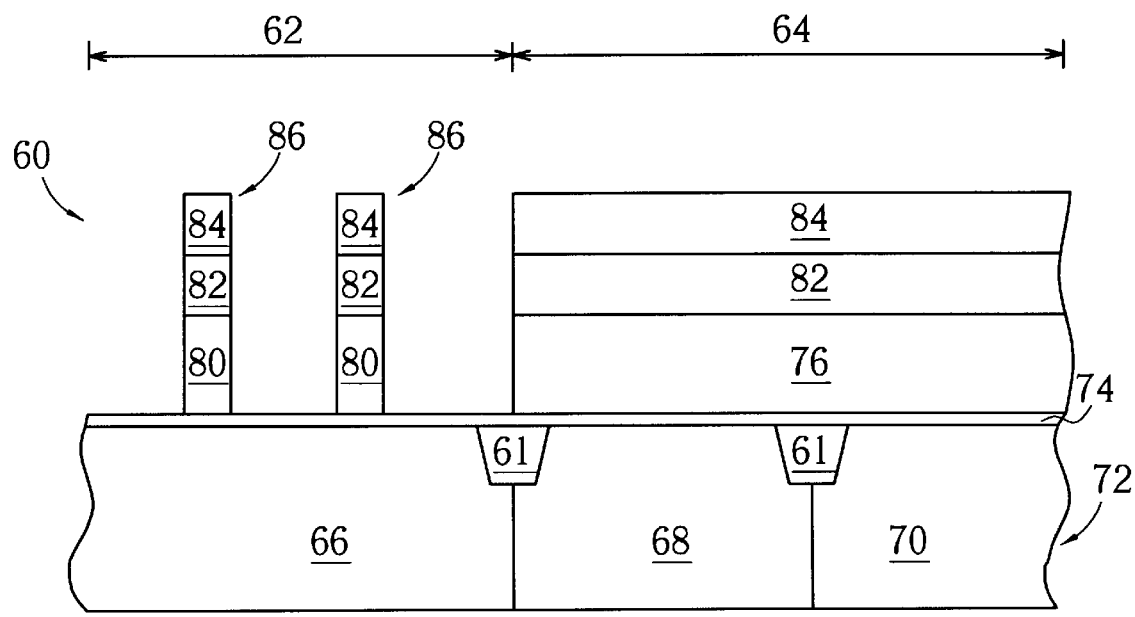

Thereafter, as shown in FIG. 11, after removing the mask layer 78 in the periphery circuit region 64, a passivation layer 82 and a photoresist layer 84 are formed in sequence on the surface of the semiconductor wafer 60. The passivation layer 82 is composed of a silicon nitride compound. A silicon-oxy-nitride ($SiO_xN_y$) layer (not shown) is further disposed on the bottom of the passivation layer 82 and functions as an anti-reflection coating (ARC) layer. Next, a photolithographic process is performed to define a plurality of gate patterns 86 in the photoresist layer 84 in the memory array region 62. Then, the gate patterns of the photoresist layer 84 are used as a hard mask to etch the passivation layer 82 and the doped polysilicon layer 80 positioned in the memory array region 62 down to the surface of the dielectric layer 74. A plurality of gates 86 are thus formed in the memory array region 62, as shown in FIG. 12.

Figure 13:
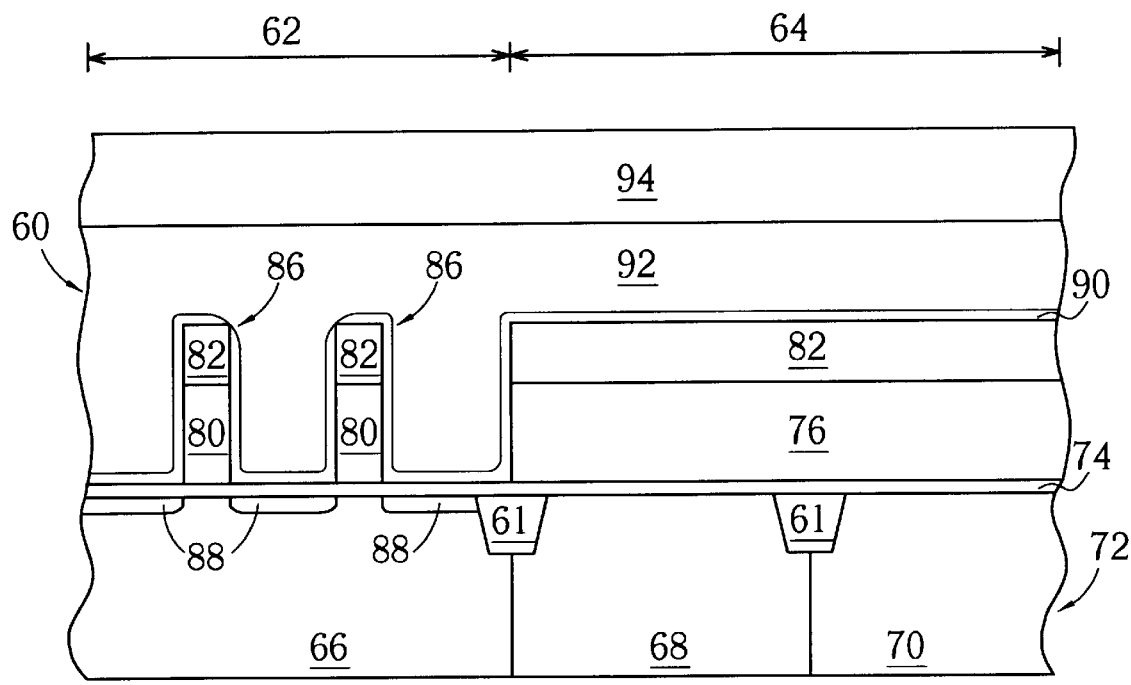
Figure 14:
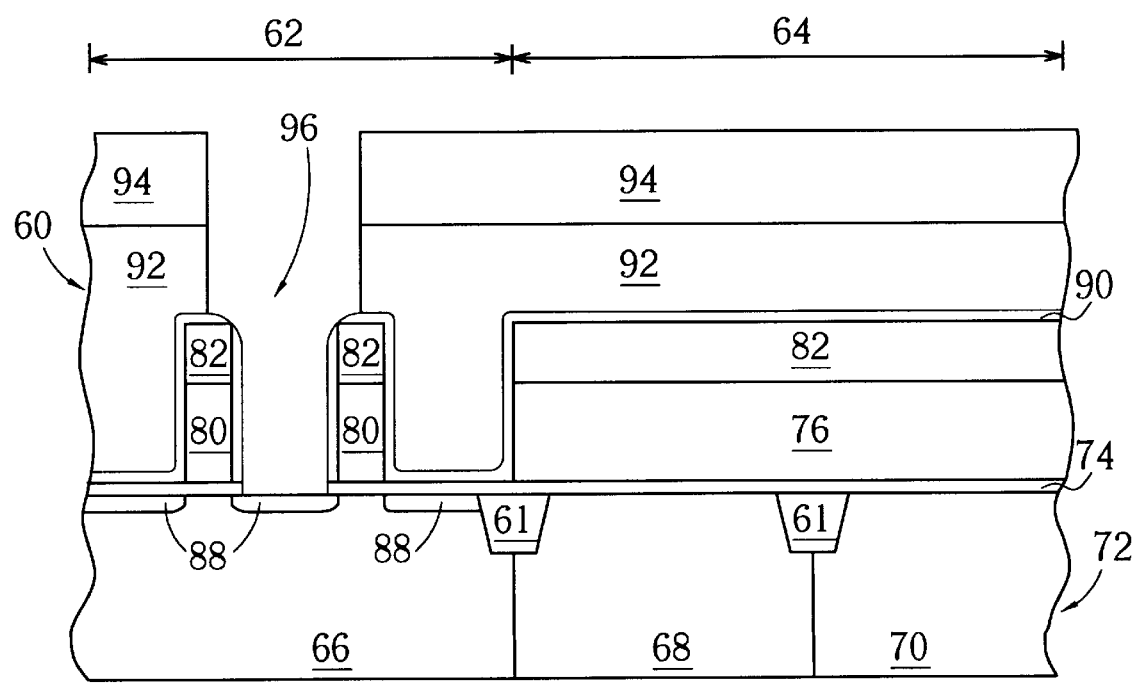

Then, as shown in FIG. 13, after removing the photoresist layer 84, an ion implantation process is performed to form lightly doped drains (LDD) 88 adjacent to each gate 86 of the memory array region 62. A silicon nitride layer 90, a dielectric layer 92, and a photoresist layer 94 are formed in sequence on the surface of the semiconductor wafer 60. A photolithographic process is then performed to define a plurality of contact plug patterns in the photoresist layer 94 of the memory array region 62. The contact plug patterns of the photoresist layer 94 are then used as a hard mask to etch the dielectric layer 92, silicon nitride 90 and dielectric layer 74 down to the surface of the silicon substrate 72. Thus, contact plugs holes 96 are formed in the dielectric layer 92 that are to function as bit-line contact holes and node contact holes. FIG. 14 only shows a bit-line contact hole.

Figure 15:
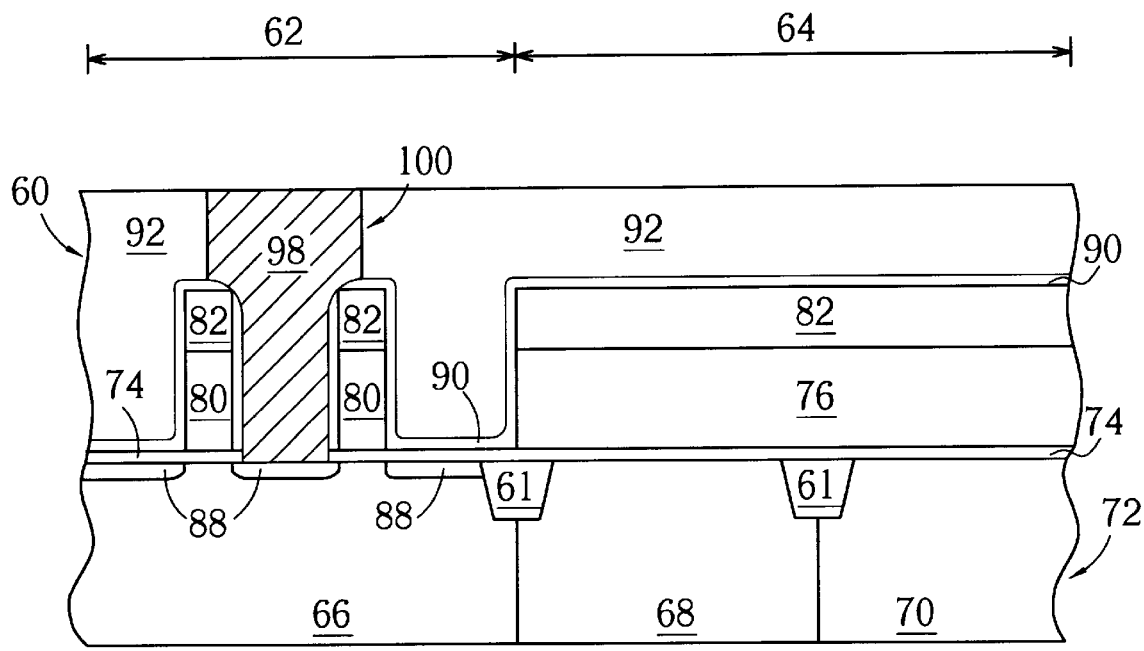

As shown in FIG. 15, after removing the photoresist layer 94, a polysilicon layer 98 is used to fill the contact plug hole 96 in the memory array region 62 by performing a deposition process and planarization process, and functions as a contact plug 100. The contact plug 100 is used as a bit-line contact of the embedded memory, but the contact plug used as a node contact in the memory array region 62 is not shown in FIG. 15.

Figure 16:
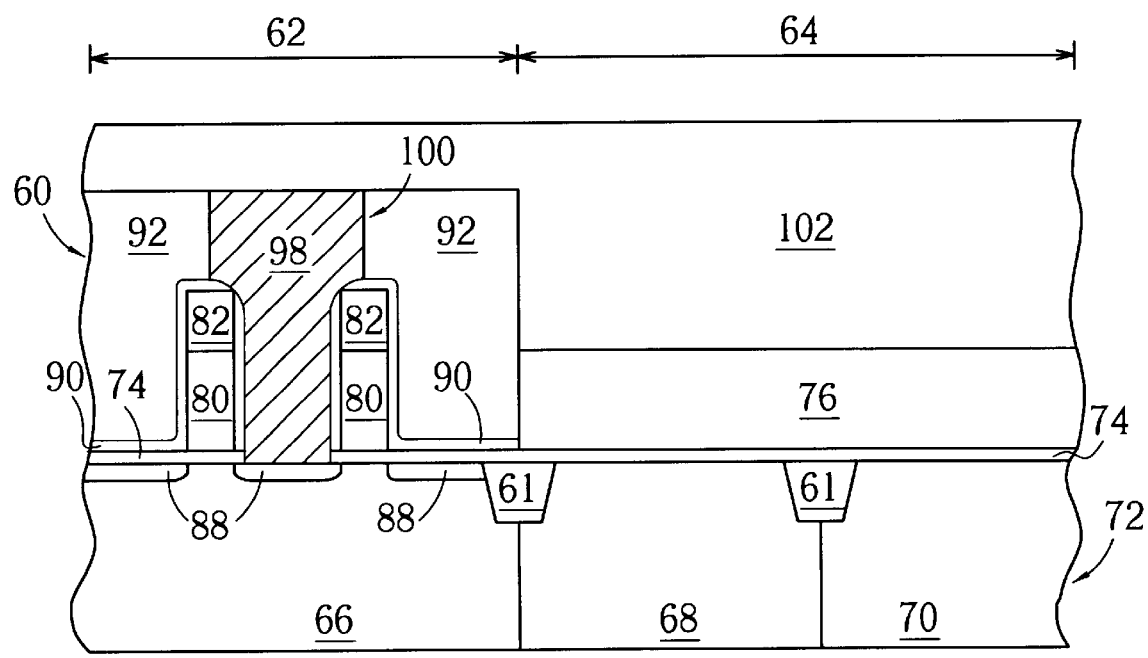
Figure 17:
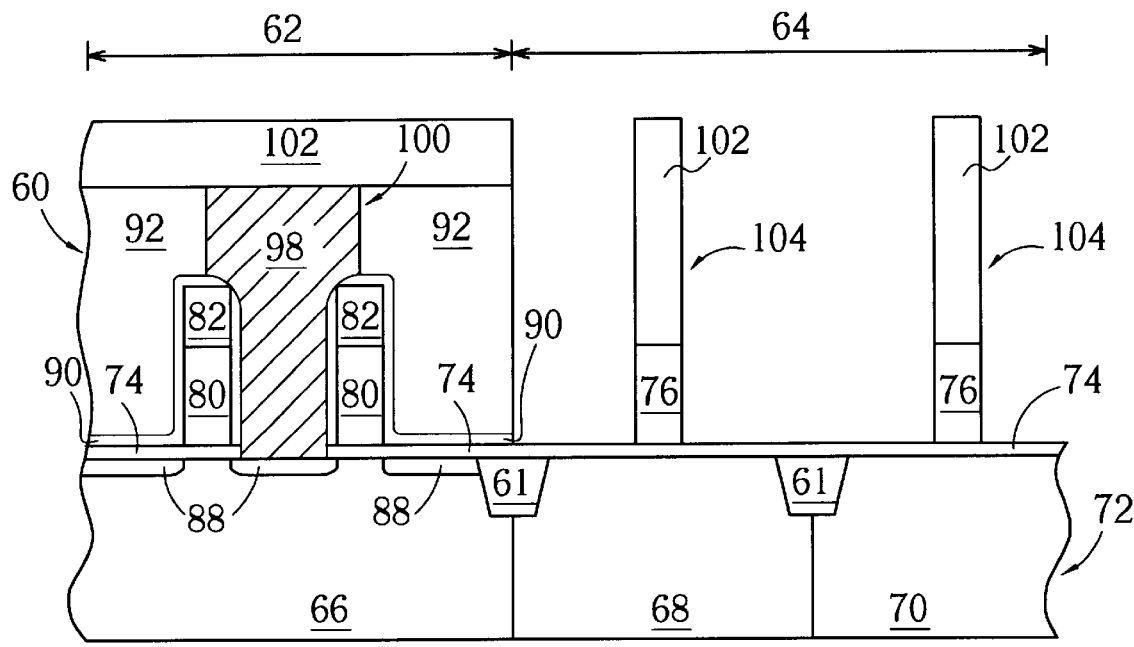

Thereafter, as shown in FIG. 16, the dielectric layer 92, the silicon nitride 90, and the passivation layer 82 in the periphery circuit region 64 are removed, followed by forming a photoresist layer 102 on the surface of the semiconductor wafer 60. Before forming he photoresist layer 102, a silicon-oxy-nitride layer (not shown) can be also formed on the surface of the semiconductor wafer 60 to serve as an anti-reflection coating (ARC) layer. A photolithographic process is then performed to define a plurality of gate patterns 104 in the photoresist layer 102 in the periphery circuit region 64. Next, the gate patterns of the photoresist layer 102 are used as a hard mask to etch the undoped polysilicon layer 76 in the periphery circuit region 64 down to the surface of the dielectric layer 74 so as to form each gate 104 in the periphery circuit region 64, as shown in FIG. 17.

Figure 18:
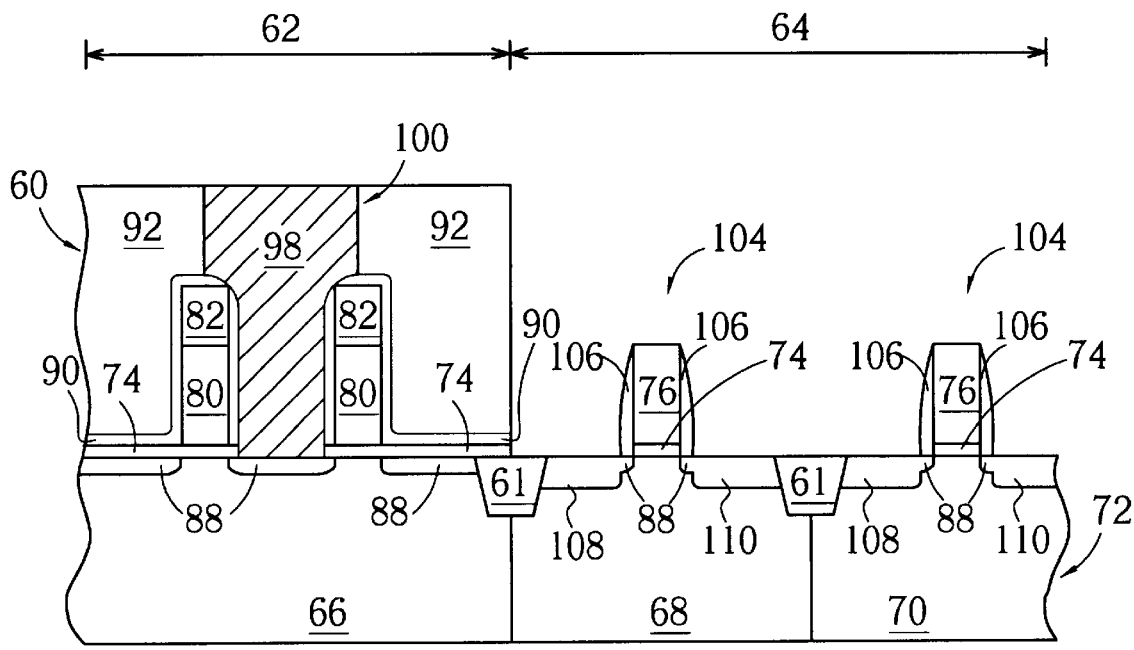

As shown in FIG. 18, after removing the photoresist layer 102 and the silicon-oxy-nitride layer (not shown) beneath the photoresist layer 102, lightly doped drains (LDD) 88 and spacers 106 are respectively formed adjacent to each gate 104 in the periphery circuit region 64. Next, an ion implantation process is performed to form sources 108 and drains 110 adjacent to each gate 104 in the periphery circuit region 64.

Figure 19:
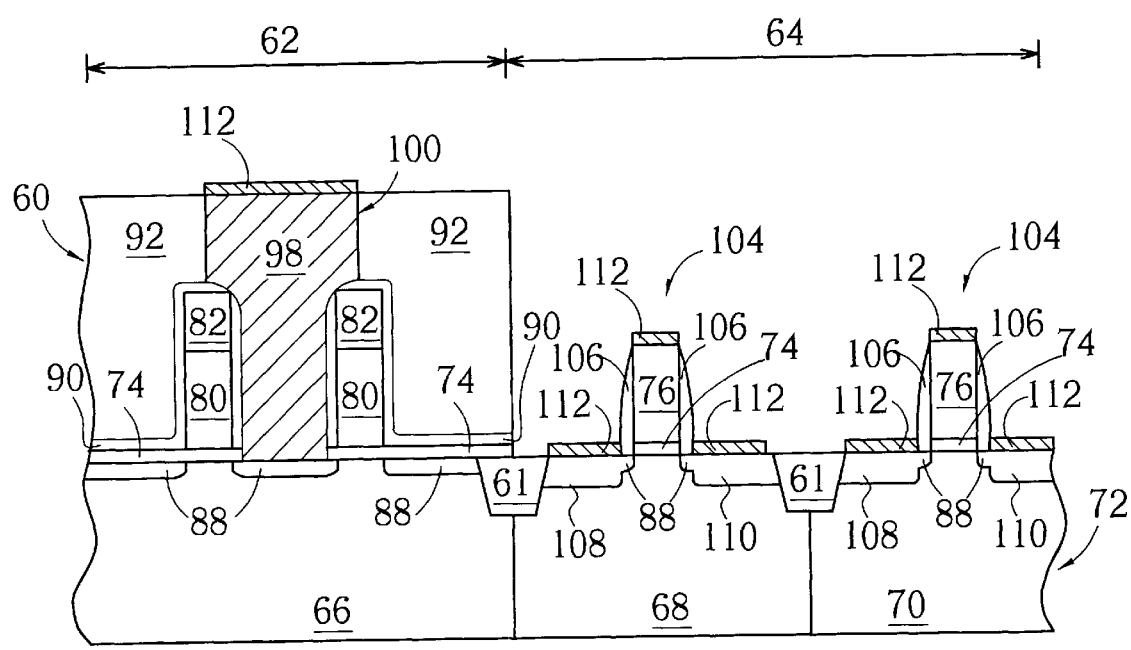

After the formation of the sources 108 and the drains 110 of each MOS transistor in the periphery circuit region 64, as shown in FIG. 19, a metal layer (not shown), made of Co, is formed on the surface of the semiconductor wafer 60. The metal layer covers the surfaces of each contact plug 100 in the memory array region 62 and each source 108, the drain 110, and the gate 104 in the periphery circuit region 64. Then, a first rapid thermal process (RTP) is perform data temperature between 400° C. and 600° C. for a duration of 10 to 50 seconds. As a result, a self-aligned silicide layer 112 is formed on the top surface of each contact plug 100 in the memory array region 62, on the top surface of each gate 104, and on the surface of each source 108 and drain 110 in the periphery circuit region 64. Then, a wet etching process is performed to remove the portions of the metal layer that do not react with the surface of the semiconductor wafer 60. Finally, a second rapid thermal process (RTP) is performed at a temperature between 600° C. to 800° C. for a duration of 10 to 50 seconds, leading to a reaction of the $Co_2Si$ and CoS in the silicide layer 112 to form $CoSi_2$, which has a lower resistance. Co can also be replaced by other metals, such as Ti, Ni, or Mo to form the metal layer.

The present method of the fabrication of contact plugs in an embedded memory involves first forming gates and LDDs of each MOS transistor in the memory array region, then directly forming each contact plug in the memory array region. Therefore, after forming each MOS transistor in the periphery circuit region, a self-aligned silicide (salicide) process can be performed simultaneously in each contact plug of the memory array region and each source, drain and gate of the periphery circuit region. As a result, the contact resistance on the top surface of each contact plug in memory array region, on the top surface of each gate and on the surface of each source and drain in the periphery circuit region are decreased, which increases electrical performance.

In contrast to the prior art method of fabricating contact plugs of an embedded memory, the fabrication method according to the present invention integrates the fabrication process of the MOS transistor and each contact plug in the embedded memory. Therefore, the number of photomasks used in the process is reduced, thus improving reliability and control as well as reducing production costs and decreasing the contact resistance of each contact plug.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for fabricating contact plugs of an embedded memory, the method comprising:

providing a semiconductor wafer with both a memory array region and a periphery circuit region defined on a surface of a silicon substrate of the semiconductor wafer;

forming a first dielectric layer and an undoped polysilicon layer in sequence on the surface of the semiconductor wafer;

performing a first ion implantation process on the undoped polysilicon layer in the memory array region to transform the undoped polysilicon layer in the memory array region to a doped polysilicon layer;

forming a passivation layer and a first photoresist layer in sequence on the surface of the semiconductor wafer;

performing a first photolithographic process to define a plurality of gate patterns in the first photoresist layer in the memory array region;

using the gate patterns of the first photoresist layer as a hard mask to etch the passivation layer and the doped polysilicon layer located in the memory array region down to a surface of the first dielectric layer to form gates in the memory array region;

removing the first photoresist layer;

performing a first ion implantation process to form a lightly doped drain (LDD) adjacent to each gate in the memory array region;

forming a silicon nitride layer, a second dielectric layer, and a second photoresist layer in sequence on the surface of the semiconductor wafer;

performing a second photolithographic process to define a plurality of contact plug patterns in the second photoresist layer in the memory array region;

using the contact plug patterns of the second photoresist layer as a hard mask to etch the second dielectric layer, the silicon nitride layer, and the first dielectric layer located in the memory array region down to the surface of the silicon substrate to form a plurality of contact plug holes in the second dielectric layer;

removing the second photoresist layer;

filling each contact plug hole with a polysilicon layer to form each contact plug in the memory array region;

removing the second dielectric layer, the silicon nitride layer and the passivation layer in the periphery circuit region;

forming a third photoresist layer on the surface of the semiconductor wafer;

performing a third photolithographic process to define a plurality of gate patterns in the third photoresist layer in the periphery circuit region;

using the gate patterns of the third photoresist layer as a hard mask to etch the undoped polysilicon layer located in the periphery circuit region down to the surface of the first dielectric layer to form gates in the periphery circuit region;

removing the third photoresist layer;

in the periphery circuit region, forming an LDD adjacent to each gate, and a spacer on the walls of each gate;

forming a source and a drain adjacent to each gate in the periphery circuit region; and performing a self-aligned silicide (salicide) process to form a metal silicide layer on a top surface of each contact plug, on a top surface of each gate, and on a surface of each source and drain in the periphery circuit region.

2. The method of claim 1 wherein the first dielectric layer is composed of silicon dioxide ($SiO_2$) and functions as a gate oxide layer for each gate.

3. The method of claim 1 wherein the passivation layer is composed of silicon nitride, and a silicon-oxy-nitride ($SiO_xN_y$) layer is disposed at a bottom of the passivation layer to serve as an anti-reflection coating (ARC) layer.

4. The method of claim 1 where in before forming the third photoresist layer on the surface of the semiconductor wafer, a silicon-oxy-nitride ($SiO_xN_y$) layer is formed on the surface of the semiconductor wafer to serve as an ARC layer.

5. The method of claim 4 wherein after removing the third photoresist layer, the silicon-oxy-nitride ($SiO_xN_y$) layer is also removed.

6. The method of claim 1 wherein the salicide process comprises:

forming a metal layer on the surface of the semiconductor wafer, the metal layer covering the contact plugs in the memory array area and the surfaces of the sources, the drains, and the gates in the periphery circuit region;

performing a first rapid thermal process (RTP);

removing portions of the metal layer that do not react with the surface of the semiconductor wafer; and performing a second rapid thermal process (RTP).

7. The method of claim 6 wherein the metal layer is composed of cobalt(Co), titanium(Ti), nickel(Ni), or molybdenum (Mo).

8. The method of claim 1 wherein each contact plug functions as a bit-line contact and a node contact of the embedded memory.

9. A method for fabricating contact plugs with low contact resistance, the method comprising:

providing a semiconductor wafer with both a memory array region and a periphery circuit region defined on a surface of a silicon substrate of the semiconductor wafer;

forming a first dielectric layer and an undoped polysilicon layer in sequence on the surface of the semiconductor wafer;

performing a first ion implantation process on the undoped polysilicon layer in the memory array region to transform the undoped polysilicon layer in the memory array region to a doped polysilicon layer;

forming a passivation layer and a first photoresist layer in sequence on the surface of the semiconductor wafer;

performing a first photolithographic process to define a plurality of gate patterns in the first photoresist layer in the memory array region;

using the gate patterns of the first photoresist layer as a hard mask to etch the passivation layer and the doped polysilicon layer located in the memory array region down to a surface of the first dielectric layer to form gates in the memory array region;

removing the first photoresist layer;

performing a first ion implantation process to form a lightly doped drain (LDD) adjacent to each gate in the memory array region;

forming a silicon nitride layer, a second dielectric layer, and a second photoresist layer in sequence on the surface of the semiconductor wafer;

performing a second photolithographic process to define a plurality of contact plug patterns in the second photoresist layer in the memory array region;

using the contact plug patterns of the second photoresist layer as a hard mask to etch the second dielectric layer, the silicon nitride layer, and the first dielectric layer located in the memory array region down to the surface of the silicon substrate so as to form a plurality of contact plug holes in the second dielectric layer;

removing the second photoresist layer;

filling each contact plug hole with a polysilicon layer to form contact plugs in the memory array region;

removing the second dielectric layer, the silicon nitride layer, and the passivation layer in the periphery circuit region;

forming a third photoresist layer on the surface of the semiconductor wafer;

performing a third photolithographic process to define a plurality of gate patterns in the third photoresist layer in the periphery circuit region;

using the gate patterns of the third photoresist layer as a hard mask to etch the undoped polysilicon layer located in the periphery circuit region down to the surface of the first dielectric layer to form gates in the periphery circuit region;

removing the third photoresist layer;

in the periphery circuit region, forming an LDD adjacent to each gate, and a spacer on the walls of each gate;

forming a source and a drain adjacent to each gate in the periphery circuit region; and performing a self-aligned silicide (salicide) process to form a metal silicide layer on a top surface of each contact plug, on a top surface of each gate, and on a surface of each source and drain in the periphery circuit region;

wherein the metal silicide layer formed on the top surface of each contact plug is used to reduce the contact resistance of each contact plug.

10. The method of claim 9 where in the first dielectric layer is composed of silicon dioxide ($SiO_2$) and functions as a gate oxide layer for each gate.

11. The method of claim 9 wherein the passivation layer is composed of silicon nitride, and a silicon-oxy-nitride ($SiO_xN_y$) layer is disposed at a bottom of the passivation layer to serve as an anti-reflection coating (ARC) layer.

12. The method of claim 9 wherein before forming the third photoresist layer on the surface of the semiconductor wafer, a silicon-oxy-nitride ($SiO_xN_y$) layer is formed on the surface of the semiconductor wafer to serve as an ARC layer.

13. The method of claim 12 wherein after removing the third photoresist layer, the silicon-oxy-nitride ($SiO_xN_y$) layer is also removed.

14. The method of claim 9 wherein the salicide process comprises:

forming a metal layer on the surface of the semiconductor wafer, the metal layer covering the contact plugs in the memory array area, and surfaces of the sources, the drains, and the gates in the periphery circuit region;

performing a first rapid thermal process (RTP);

removing portions of the metal layer that do not react with the surface of the semiconductor wafer; and performing a second rapid thermal process (RTP).

15. The method of claim 14 wherein the metal layer is composed of cobalt(Co), titanium(Ti), nickel(Ni), or molybdenum (Mo).

16. The method of claim 9 wherein each contact plug functions as a bit-line contact and a node contact of the embedded memory.

\* \* \* \* \*